(12) United States Patent
Kwon et al.

(10) Patent No.: US 8,369,427 B2
(45) Date of Patent: Feb. 5, 2013

(54) METHOD AND APPARATUS FOR SYMBOL TRANSMISSION IN AN OFDM MOBILE COMMUNICATION SYSTEM

(75) Inventors: Hwan-Joon Kwon, Suwon-si (KR);
Joon-Young Cho, Suwon-si (KR);
Jae-Chon Yu, Suwon-si (KR);
Youn-Hyoung Heo, Suwon-si (KR)

(73) Assignee: Samsung Electronics Co., Ltd (KR)

( * ) Notice: Subject to any disclaimer, the term of this patent is extended or adjusted under 35 U.S.C. 154(b) by 1230 days.

(21) Appl. No.: 12/141,335

(22) Filed: Jun. 18, 2008

(65) Prior Publication Data

US 2008/0310535 A1 Dec. 18, 2008

(30) Foreign Application Priority Data

Jun. 18, 2007 (KR) .................. 10-2007-0059626

(51) Int. Cl.
*H04K 1/10* (2006.01)
*H04L 27/28* (2006.01)
(52) U.S. Cl. ........................ 375/260; 375/259
(58) Field of Classification Search ............ 375/260
See application file for complete search history.

(56) References Cited

U.S. PATENT DOCUMENTS

| | | | |
|---|---|---|---|
| 6,215,816 B1* | 4/2001 | Gillespie et al. | 375/219 |
| 6,697,906 B1* | 2/2004 | Ayukawa et al. | 710/316 |
| 7,065,298 B1* | 6/2006 | Munroe et al. | 398/77 |
| 2002/0126740 A1* | 9/2002 | Giannakis et al. | 375/143 |
| 2003/0210663 A1* | 11/2003 | Everson et al. | 370/329 |
| 2005/0210365 A1* | 9/2005 | Kim et al. | 714/792 |
| 2005/0271131 A1* | 12/2005 | Hafed et al. | 375/224 |
| 2006/0008014 A1* | 1/2006 | Tamaki et al. | 375/260 |
| 2006/0008025 A1* | 1/2006 | Vummintala et al. | 375/267 |
| 2007/0153729 A1* | 7/2007 | Alapuranen | 370/329 |
| 2007/0153833 A1* | 7/2007 | Chang et al. | 370/477 |
| 2007/0245202 A1* | 10/2007 | Kim et al. | 714/748 |
| 2008/0031191 A1* | 2/2008 | Kashima et al. | 370/329 |
| 2008/0151981 A1* | 6/2008 | Ichiyama et al. | 375/226 |
| 2008/0212514 A1* | 9/2008 | Chen | 370/315 |
| 2008/0240159 A1* | 10/2008 | Palanki et al. | 370/474 |
| 2008/0267122 A1* | 10/2008 | Han et al. | 370/329 |
| 2008/0298195 A1* | 12/2008 | Kanatake et al. | 369/53.36 |

* cited by examiner

*Primary Examiner* — Erin File
(74) *Attorney, Agent, or Firm* — The Farrell Law Firm, P.C.

(57) ABSTRACT

A mapping method and an apparatus, which uniformly distribute bits included in transmission symbols to various resource blocks in mapping the transmission symbols to the resource blocks for transmission in an OFDMA mobile communication system. A sub-packet generator generates a sub-packet by selecting symbols from coded symbols including a first bit group and a second bit group, the first bit group having a different priority than the second bit group. A divider divides each bit group of the sub-packet into as many bit streams as previously allocated resource blocks. A resource block mapper maps the divided bit streams to the resource blocks, respectively, and outputs the bit streams for transmission.

26 Claims, 11 Drawing Sheets

METHOD AND APPARATUS FOR SYMBOL TRANSMISSION IN AN OFDM MOBILE COMMUNICATION SYSTEM

PRIORITY

This application claims priority under 35 U.S.C. §119(a) to an application entitled "Method And Apparatus For Symbol Transmission In An OFDM Mobile Communication System" filed in the Korean Industrial Property Office on Jun. 18, 2007 and assigned Serial No. 2007-59626, the contents of which are hereby incorporated by reference.

BACKGROUND OF THE INVENTION

1. Field of the Invention

The present invention relates generally to a mobile communication system, and more particularly to a method and an apparatus for mapping transmission symbols to resources and then transmitting the symbols in a mobile communication system utilizing an Orthogonal Frequency Division Multiplexing (OFDM) scheme.

2. Description of the Related Art

Recently, for mobile communication systems, many studies have been and are being conducted on using an Orthogonal Frequency Division Multiplexing (OFDM) scheme for high-speed data transmission over wired/wireless channels. The OFDM scheme, which transmits data using multiple carriers, is a special type of a Multiple Carrier Modulation (MCM) scheme in which a serial symbol sequence is converted into parallel symbol sequences and the parallel symbol sequences are modulated with a plurality of mutually orthogonal subcarriers (or subcarrier channels) before being transmitted.

A system differentiating multiple users through the multiple sub-carriers while utilizing the OFDM scheme as a basic transmission scheme, that is, a system supporting multiple users by allocating different sub-carriers to different users, is generally called an "Orthogonal Frequency Division Multiple Access (OFDMA) scheme."

A Hybrid Automatic Repeat reQuest (HARQ) scheme is one of the important techniques used to improve data throughput and reliability of data transmission in a packet-based mobile communication system. HARQ corresponds to a combination of the techniques of Automatic Retransmission Request (ARQ) and Forward Error Correction (FEC). According to ARQ, which is being widely used in a wired/wireless data communication system, a transmitter transmits data packets with sequence numbers attached to the data packets according to a pre-established scheme, and a receiver requests retransmission of a missing packet from among the received packets by using the sequence numbers, thereby achieving reliable data transmission.

Further, for FEC, each data packet is transmitted together with a redundant bit added thereto according to a predetermined rule, such as convolutional encoding or turbo encoding, so that the originally-transmitted data can be demodulated without noise or fading, which may occur during data transmission and reception.

In a system using HARQ, i.e., a combination of the above-described ARQ and FEC, the receiver performs a Cyclic Redundancy Check (CRC) for data demodulated through a predetermined inverse FEC process, in order to determine if the data has an error. As a result of the CRC, when the data has no error, the system using the HARQ feeds back an Acknowledgement (ACK) to the transmitter, so that the transmitter transmits a next data packet. However, when the CRC check shows that the data has an error, the HARQ system feeds back a Non-Acknowledgement (NACK) to the transmitter, so that the transmitter retransmits the previously transmitted data packet.

During this process, the receiver obtains an energy gain by combining the retransmitted packet with the previously transmitted packet. Accordingly, the HARQ system can achieve much improved performance in comparison with a typical ARQ system that does not perform such a combining process.

FIG. 1A illustrates an example of a conventional HARQ procedure. More specifically, in FIG. 1A, the horizontal axis is a time axis, and the data channel is a channel through which a data packet is transmitted.

In step 101, a transmitter initially transmits a data packet. In step 102, a receiver, having received the initially transmitted data packet, demodulates the received data packet and determines if the received data packet has an error during the demodulation. When the receiver determines that the transmitted data has not been correctly demodulated, i.e., there is an error, the receiver feeds back an NACK to the transmitter in step 102. The determination if the received data packet has an error can be achieved through a CRC check, etc.

Upon receiving the NACK, the transmitter performs a first retransmission of the data packet in step 103. However, even when the transmitter retransmits the same data as the data packet transmitted at the initial transmission in step 103, the same data may have different redundancies, i.e., different coded symbols may be transmitted. As used herein, the same data packet transmitted in steps 101, 103, and 105 is called a "sub-packet."

Upon receiving the data packet by the first retransmission, the receiver combines the data packet of the first retransmission with the data packet of the initial transmission, according to a predetermined rule, and then demodulates the data channel using the combined data. Through a CRC of the data channel during the demodulation, when the receiver determines that the transmitted data has not been correctly demodulated, i.e., there is still an error, the receiver feeds back an NACK to the transmitter in step 104.

Upon receiving the NACK in step 104, the transmitter performs a second retransmission of the data packet in step 105, after passage of a predetermined time interval from the time point of the first retransmission. As described above, the data channels of the initial transmission in step 101, the first retransmission in step 103, and the second retransmission in step 105 carry the same data.

Upon receiving the data packet transmitted by the second retransmission 105, the receiver combines the data of the initial transmission in step 101, the data of the first retransmission in step 103, and the data of the second retransmission in step 105 with each other, according to a predetermined rule, and then demodulates the data channel using the combined data. Through this process, when the receiver determines, by CRC for the data channel, that the transmitted data has been correctly demodulated, the receiver feeds back an ACK to the transmitter in step 106.

After receiving the ACK in step 106, the transmitter transmits an initial transmission sub-packet for a next data packet together with a control channel in step 107.

FIG. 1B is a block diagram of a conventional mobile communication system for performing an HARQ operation. Referring to FIG. 1B, an encoder 111 of a transmitter 130 encodes a predetermined data packet and outputs coded symbols. A sub-packet generator 112 selects all or a part of coded symbols output from the encoder 111 at the $k^{th}$ transmission (k=0 to m, wherein m refers to a maximum number of retransmission times) and generates a sub-packet k including the selected symbols.

A transceiver chain 113 transmits the generated sub-packet k to a receiver 170 through a predetermined transmission and reception scheme such as an OFDM scheme.

A decoder of the receiver 170 decodes the received sub-packet k, and feeds back an ACK or NACK to the sub-packet generator 112 of the transmitter 130 according to a result of the decoding. Based on the feedback, the sub-packet generator 112 prepares and transmits a retransmission data packet (i.e. a next sub-packet) of the transmitted data packet or an initial transmission sub-packet of a new data packet.

Hereinafter, the encoder 111 and the sub-packet generator 112 for the HARQ operation will be described in more detail.

FIG. 2 illustrates a method for configuring the sub-packet by using a circular buffer in a mobile communication system.

In FIG. 2, one code block 201 indicates one data packet to be transmitted at a given time point. The encoder 202 receives the single code block 201 and outputs predetermined coded symbols 203. A total number of the coded symbols 203 output from the encoder 202 is defined by a code rate of the encoder 202, which is usually called a "mother code rate." The total number of the output coded symbols 203 is usually a "mother code rate" as described above because partial or all coded symbols from among the output of the encoder 202 are selected for each sub-packet. Coded symbols, which are output from the encoder 202, include systematic symbols S, first parity symbols P1, and second parity symbols P2, each of which is called a "sub-block."

A sub-block interleaver 204 interleaves the systematic symbols S, the first parity symbols P1, and the second parity symbols P2 within each sub-block. It is considered that all the interleaved symbols, which are output from the sub-block interleaver, have been stored in a circular buffer. As used herein, the name "circular buffer" is given because configuration of symbols for each sub-packet is achieved by selecting consecutive symbols on the circular buffer, and because, when a particular sub-packet passes over a last symbol point of the circular buffer, it returns to the first symbol of the circular buffer and selects next symbols for the sub-packet. That is, the transmitter configures each sub-packet by selecting partially consecutive symbols on the circular buffer, and the receiver decodes received coded symbols after mapping the received coded symbols to proper positions on the circular buffer of the same structure.

In the example of the sub-packet configuration illustrated in FIG. 2, reference numeral 206 indicates a symbol configuration for an initial transmission sub-packet, reference numeral 207 indicates a symbol configuration for a first retransmission sub-packet (or a second transmission sub-packet), and reference numeral 208 indicates a symbol configuration for a second retransmission sub-packet (or a third transmission sub-packet).

FIG. 3 illustrates Resource Blocks (RBs), each of which is a basic unit of resource allocation in a typical OFDMA system. Referring to FIG. 3, the horizontal axis is a frequency axis, and the vertical axis is a time axis.

In FIG. 3, one resource block 301 usually includes multiple OFDM symbols along the frequency axis and multiple consecutive OFDM symbols along the time axis. Although FIG. 3 illustrates 8 resource blocks in total, it is possible to use a different number of resource blocks.

FIG. 4 illustrates a conventional method in which a sub-packet configured as described above with reference to FIG. 2 is mapped to allocated resource blocks. The circular 205 in FIG. 4 is the same as the circular buffer 205 of FIG. 2. That is, the circular buffer 205 includes a systematic part indicated by reference numeral 401 and a parity part indicated by reference numeral 402. Coded symbols 206 are selected from the circular buffer, so as to configure an initial transmission sub-packet.

It is assumed that User Equipment (UE) #1 has been allocated resource blocks 0, 2, and 4 as indicated by reference numeral 407, i.e., a sub-packet 206 is transmitted through resource blocks 0, 2, and 4. Reference numeral 408 indicates a channel response on the frequency axis at a given time point. Here, the vertical axis corresponds to the intensity of a channel.

As noted from FIG. 4, resource blocks 0 and 2 are in a relatively bad channel condition, while resource block 4 is in a relatively good channel condition. According to the conventional method, the sub-packet 206 is sequentially loaded on the allocated resource blocks. Specifically, the foremost part 404 of the sub-packet 206 is carried by the resource block 0, the middle part 405 of the sub-packet 206 is carried by the resource block 2, and the rearmost part 406 of the sub-packet 206 is carried by the resource block 4.

According to the conventional mapping method, the systematic bits may be collectively carried by the resource blocks in a relatively bad channel condition, which may significantly degrade the data reception capability. Therefore, it is necessary to improve the data reception capability by preventing the systematic bits from being collectively carried by the resource blocks in a relatively bad channel environment.

SUMMARY OF THE INVENTION

Therefore, the present invention has been designed to solve the above-mentioned problems occurring in the prior art. Accordingly, the present invention provides a mapping method and an apparatus, which can uniformly distribute bits included in transmission symbols to various resource blocks in mapping the transmission symbols to the resource blocks for transmission in an OFDMA mobile communication system.

Additionally, the present invention provides a mapping method and an apparatus, by which systematic bits having a relatively high priority in a sub-packet generated from coded symbols can be transmitted while being uniformly distributed to various resource blocks, instead of being collectively carried by resource blocks in a relatively bad channel environment.

In accordance with an aspect of the present invention, a method and an apparatus are provided for transmitting transmission symbols, after mapping the transmission symbols to resource blocks in a mobile communication system of an Orthogonal Frequency Division Multiplexing (OFDM) scheme. The method includes: dividing each bit group of transmission symbols into as many bit streams as previously allocated resource blocks, the transmission symbols including a first bit group and a second bit group, which have different priorities; mapping the divided bit streams to the resource blocks, respectively; and transmitting the bit streams.

In accordance with another aspect of the present invention, a method and an apparatus are provided for transmitting transmission symbols, after mapping the transmission symbols to resource blocks in a mobile communication system of an OFDM scheme. The method includes: generating a sub-packet by selecting symbols from coded symbols including a first bit group and a second bit group, which have different priorities; dividing each bit group of the sub-packet into as many bit streams as previously allocated resource blocks;

mapping the divided bit streams to the resource blocks, respectively; and transmitting the bit streams.

In accordance with another aspect of the present invention, a method and an apparatus are provided for transmitting transmission symbols, after mapping the transmission symbols to resource blocks in a mobile communication system of an OFDM scheme. The method includes: generating a sub-packet by selecting symbols from coded symbols including a first bit group and a second bit group, which have different priorities; configuring a block interleaver having a size of M×K wherein K indicates a number of the resource blocks and M indicates a value obtained by dividing a number of symbols transmitted by a corresponding OFDM symbol by K; outputting interleaved symbols by writing the symbols of the sub-packet low by low and reading the symbols of the sub-packet column by column; mapping the interleaved symbols to sub-carriers within previously allocated resource blocks; and transmitting the interleaved symbols.

BRIEF DESCRIPTION OF THE DRAWINGS

The above and other aspects, features, and advantages of the present invention will be more apparent from the following detailed description taken in conjunction with the accompanying drawings, in which.

DETAILED DESCRIPTION OF THE PREFERRED EMBODIMENTS

Hereinafter, preferred embodiments of the present invention will be described in detail with reference to the accompanying drawings. In the following description, a detailed description of known functions and configurations incorporated herein will be omitted when it may obscure the subject matter of the present invention.

Figure 1A:
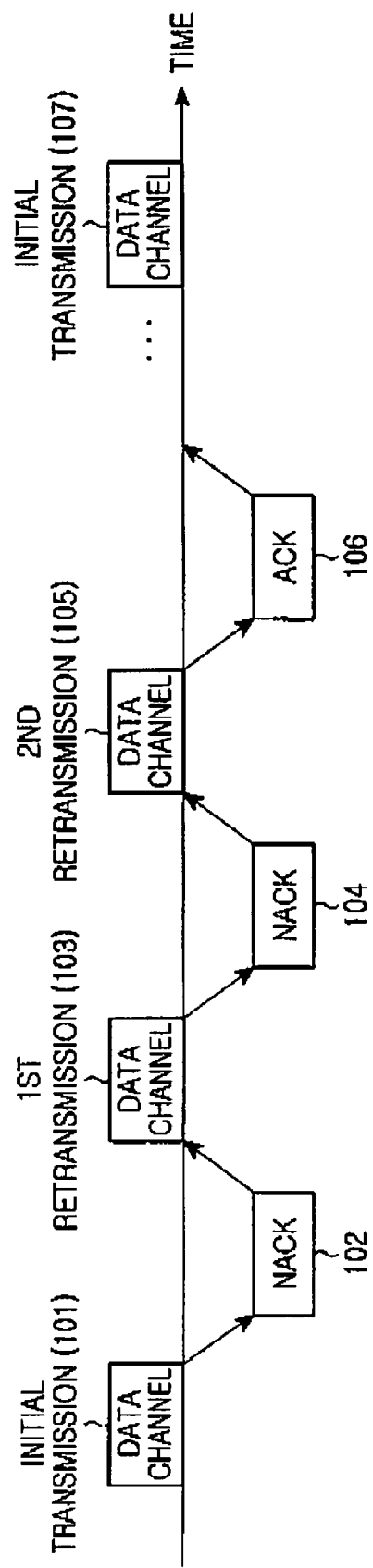
FIG. 1A illustrates an example of a conventional HARQ procedure.
Figure 1B:
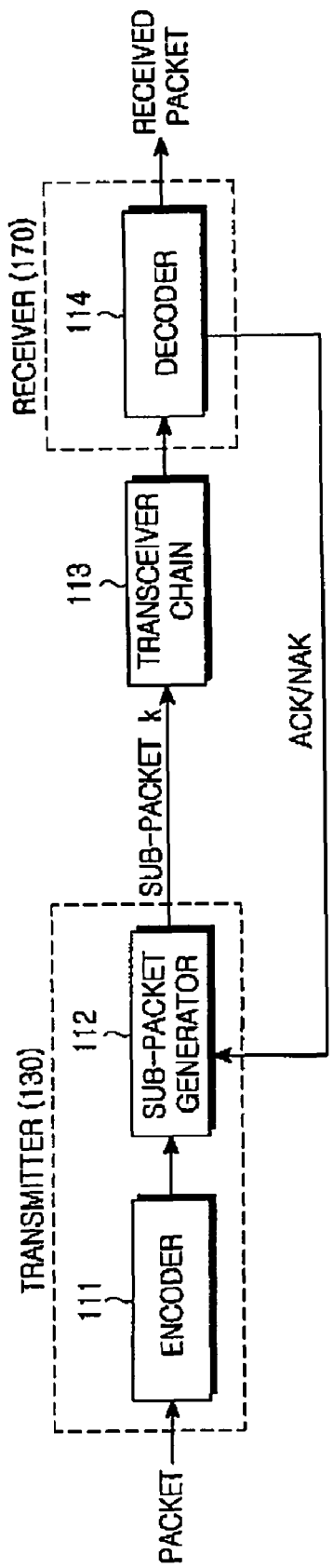
FIG. 1B is a block diagram illustrating a mobile communication system performing an HARQ operation.
Figure 2:
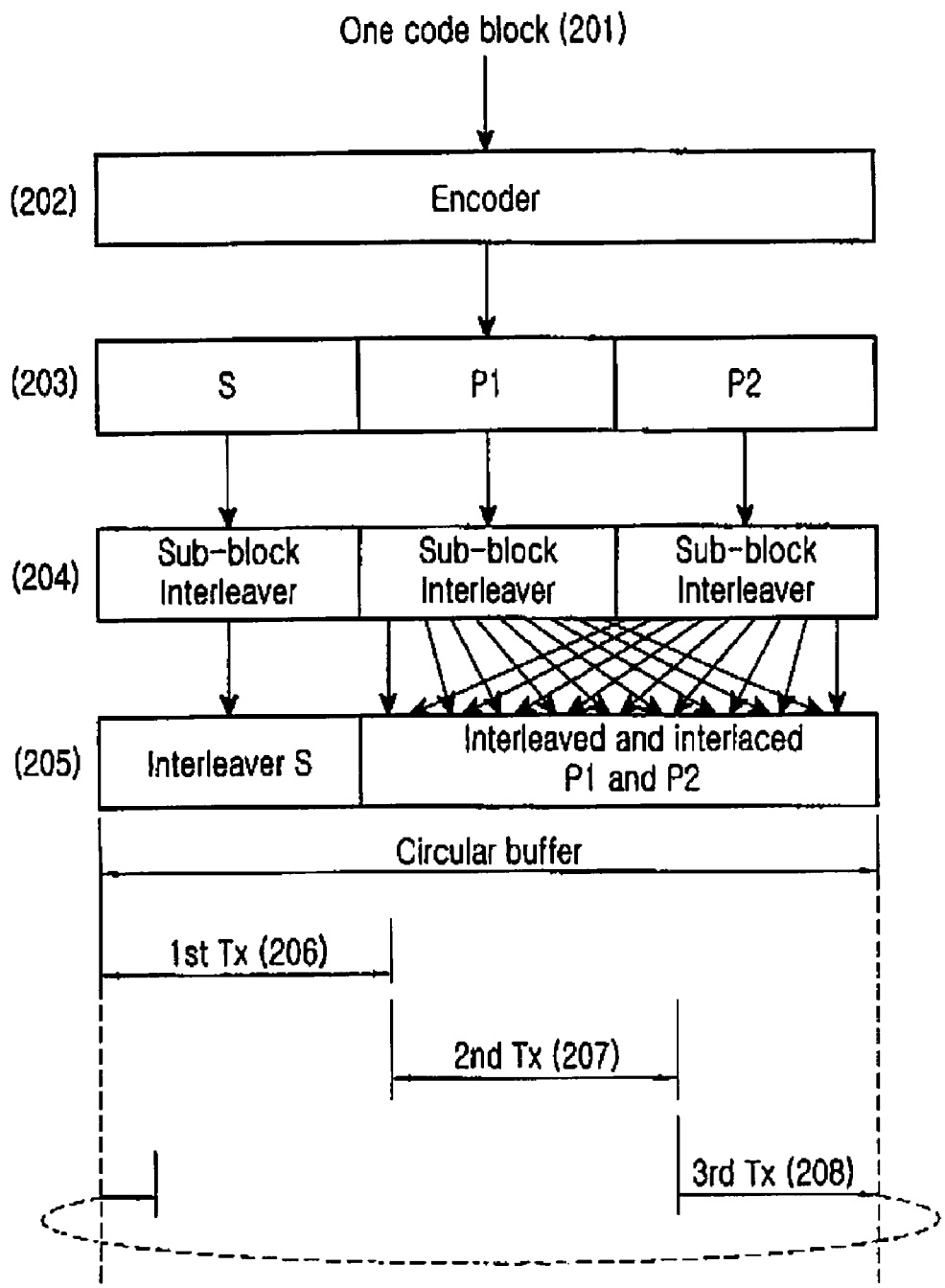
FIG. 2 illustrates a method for configuring the sub-packet using a circular buffer in a mobile communication system.
Figure 3:
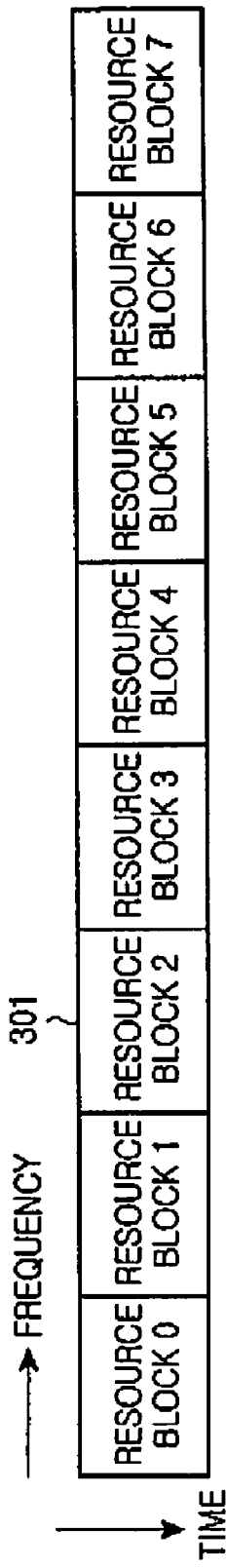
FIG. 3 illustrates Resource Blocks (RBs), each of which is a basic unit of resource allocation in a conventional OFDMA system.
Figure 4:
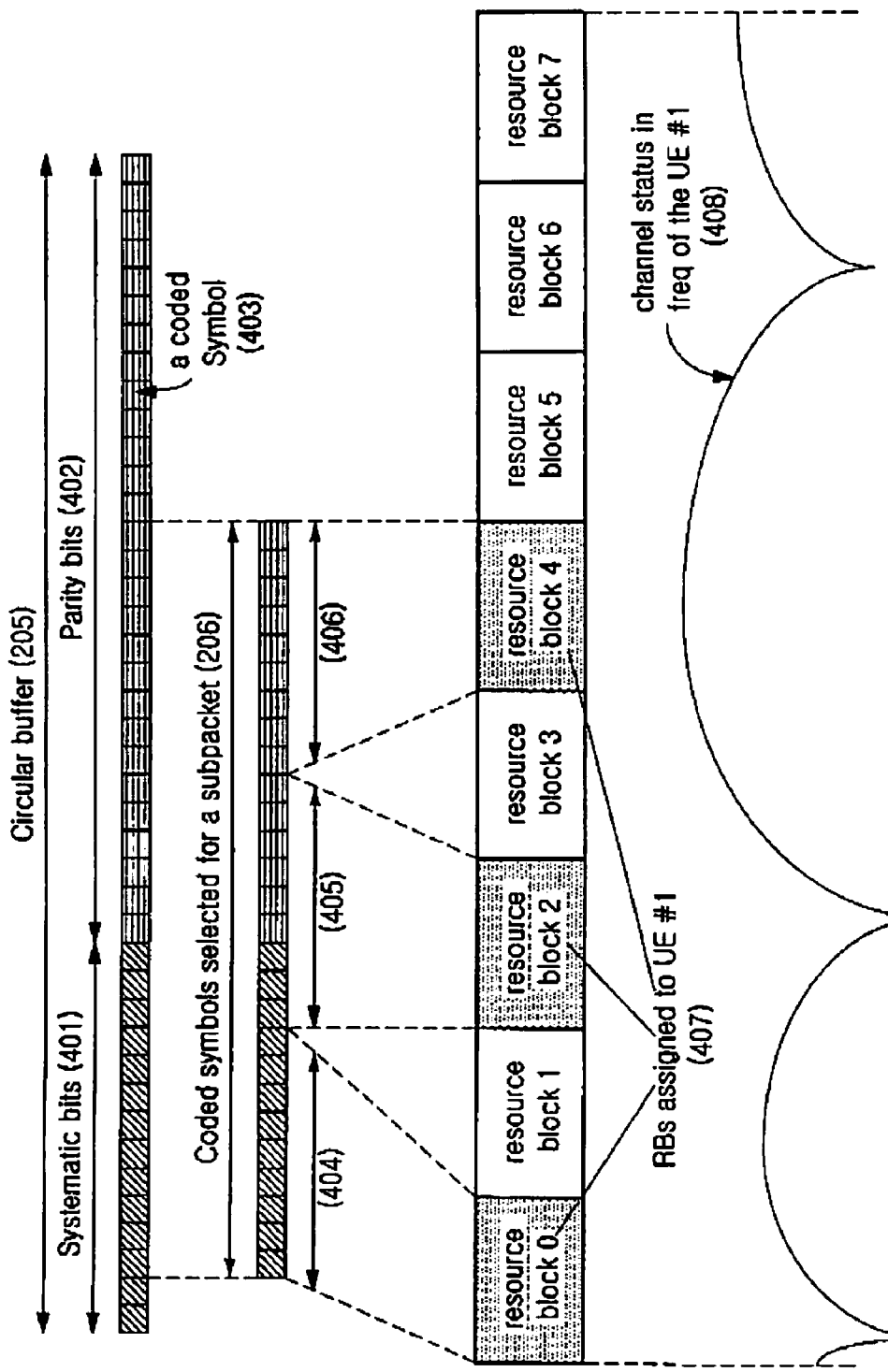
FIG. 4 illustrates a conventional method in which a sub-packet configured as described above with reference to FIG. 2 is mapped to allocated resource blocks.
Figure 5:
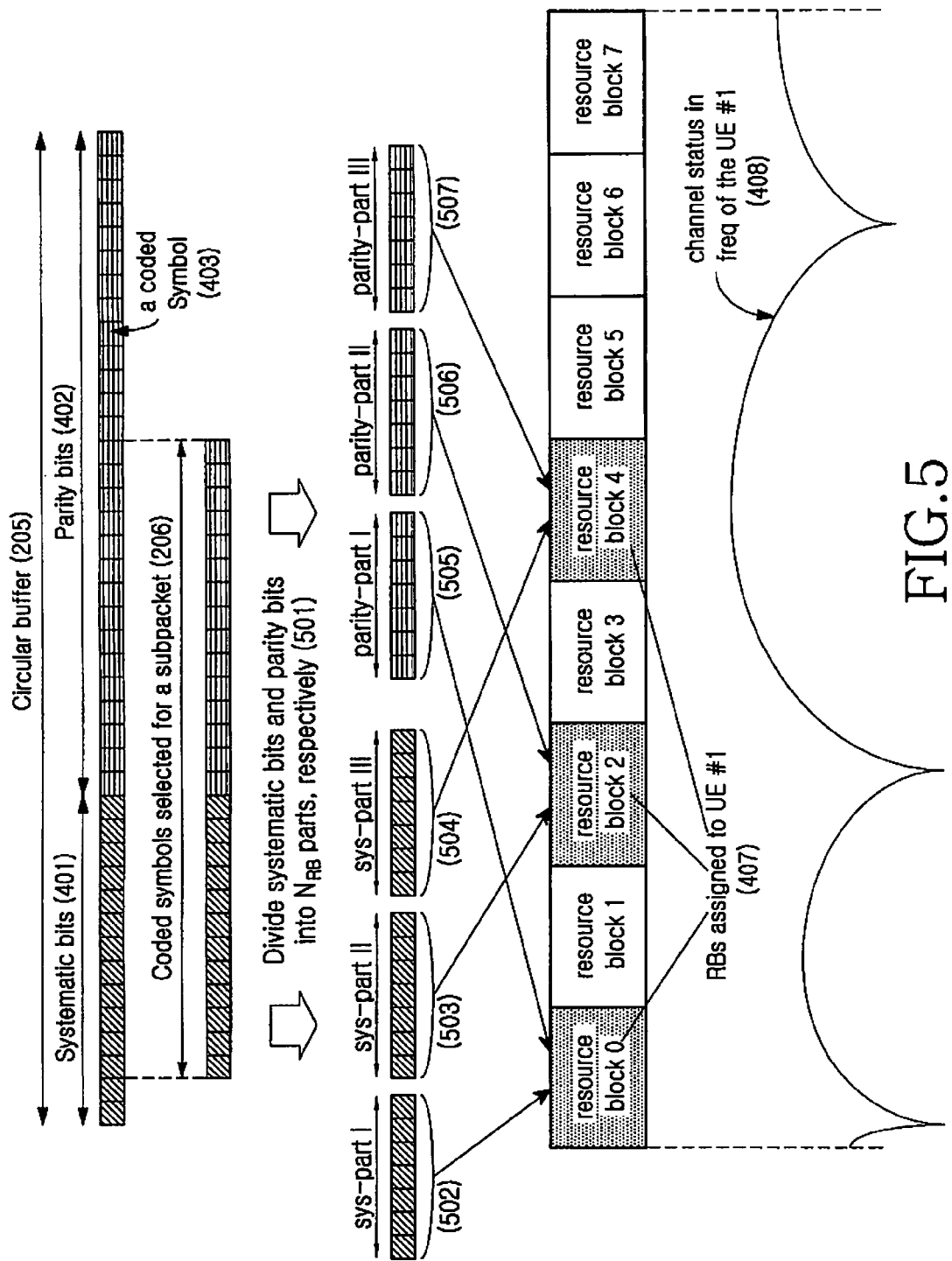
FIG. 5 illustrates a method of mapping coded symbols included in a sub-packet to multiple resource blocks according to a preferred embodiment of the present invention.

FIG. 5 illustrates a method of mapping coded symbols included in a sub-packet to multiple resource blocks according to a preferred embodiment of the present invention. More specifically, FIG. 5 illustrates a method for mapping a sub-packet to multiple resource blocks when a Node B allocates the multiple resource blocks to a particular user, configures a sub-packet, and then maps the sub-packet to the allocated resource blocks for transmission. The circular buffer indicated by reference numeral 205 in FIG. 5 is the same as the circular buffer 205 of FIG. 2. Therefore, the circular buffer 205 includes a systematic part (systematic bits) 401 having a relatively high priority and parity bits (parity bits) 402 having a relatively low priority. Reference numeral 206 is the same as 206 in FIG. 2, i.e., coded symbols 206 are selected from the circular buffer, in order to configure an initial transmission sub-packet.

Reference numeral 501 indicates a process of dividing each of the systematic part 401 and the parity part 402 of the sub-packet 206 into as many parts as the allocated resource blocks. As noted from reference numeral 407 in FIG. 5, three resource blocks including resource blocks 0, 2, and 4 are allocated to UE #1. Therefore, each of the systematic part and the parity part is divided into three parts.

Specifically, the systematic bits are divided into three parts 502, 503, and 504, and the parity bits are divided into three parts 505, 506, and 507. The divided parts are mapped to the allocated resource blocks, respectively. That is, the part 502 is allocated to the resource block 0, the part 503 is allocated to the resource block 2, the part 504 is allocated to the resource block 4, the part 505 is allocated to the resource block 0, the part 506 is allocated to the resource block 2, and the part 507 is allocated to the resource block 4. Through this process, it is possible to uniformly map the systematic bits and the parity bits to the resource blocks, which can prevent the systematic bits having a relatively high priority from being collectively mapped to particular resource blocks in a bad channel environment.

Figure 6:
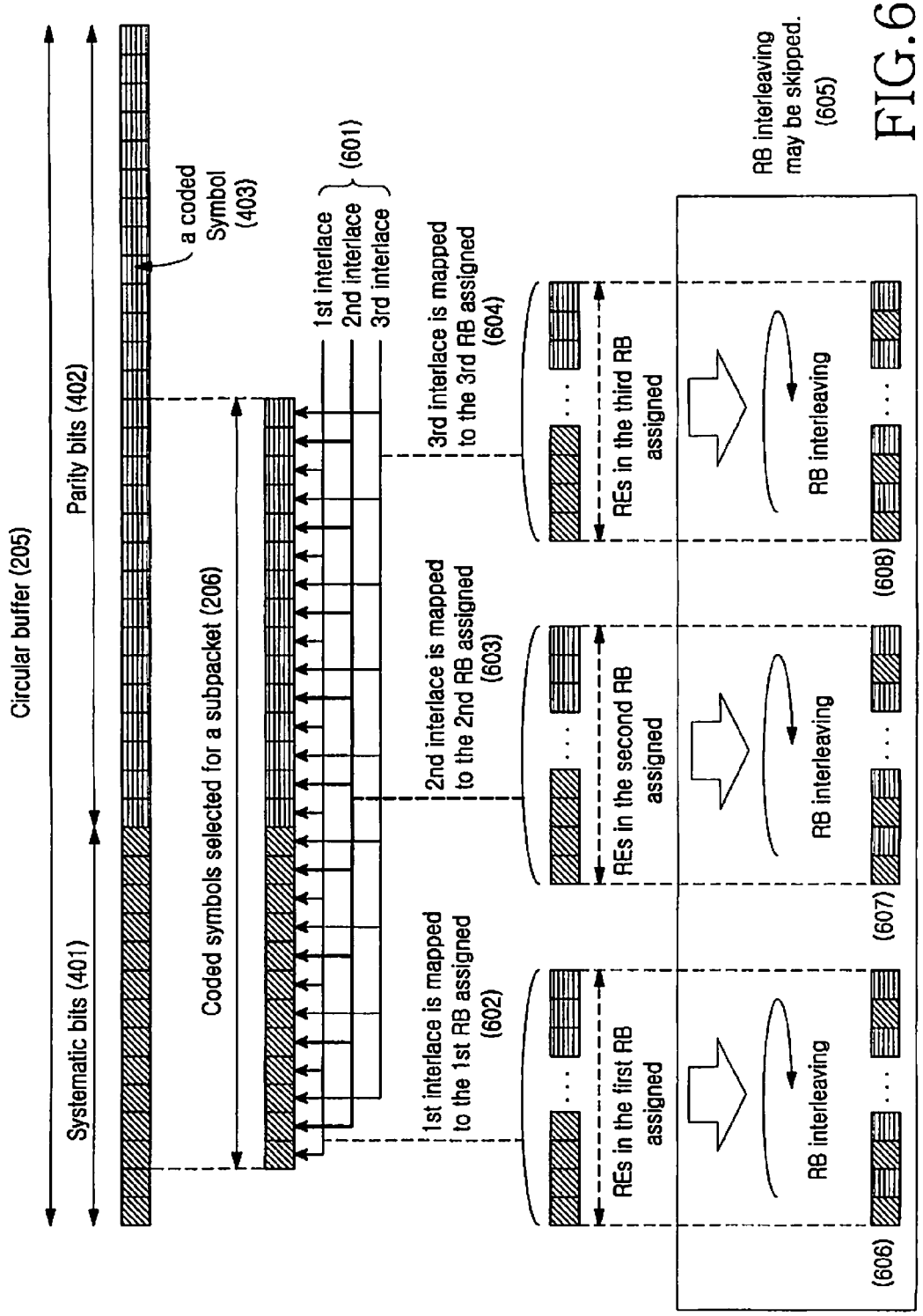
FIG. 6 illustrates step 501 in the mapping method of the present invention as described above with reference to FIG. 5.

FIG. 6 illustrates step 501 in the mapping method of the present invention as described above with reference to FIG. 5. FIG. 6 also illustrates a method for mapping a sub-packet to multiple resource blocks when a Node B allocates the multiple resource blocks to a particular user, configures a sub-packet, and then maps the sub-packet to the allocated resource blocks for transmission.

Referring to FIG. 6, as indicated by reference numeral 601, as many interlaces as the allocated resource blocks are configured from the sub-packet 206. Because three resource blocks have been allocated, the sub-packet 206 is divided into three interlaces including interlaces 0, 1, and 2 as indicated by 601. The division into interlaces refers to division of coded symbols as described in Table 1 below.

TABLE 1

If the number of all coded symbols 206 is L, the L coded symbols are indexed with 0, 1, 2, . . . , and (L − 1), and the coded symbols are divided into m interlaces,
Coded symbols corresponding to interlace 0: coded symbols corresponding to indexes 0, 3, 6, 9, . . . , and (L − m),
Coded symbols corresponding to interlace 1: coded symbols corresponding to indexes 1, 4, 7, 10, . . . , and (L − m + 1),
. . .
Coded symbols corresponding to interlace k: coded symbols corresponding to indexes (0 + k), (3 + k), (6 + k), (9 + k), . . . , and (L − m + k),
. . .
Coded symbols corresponding to interlace (m − 1): coded symbols corresponding to indexes (0 + m − 1), (3 + m − 1), (6 + m − 1) (9 + m − 1), . . . , and (L − 1).

The interlaces as configured above are mapped to allocated resource blocks, respectively. More specifically, symbols corresponding to interlace 0 are allocated to the first resource block as indicated by reference numeral 602, symbols corresponding to interlace 1 are allocated to the first resource block as indicated by reference numeral 603, and symbols corresponding to interlace 2 are allocated to the first resource block as indicated by reference numeral 604.

Based on the results of the mappings 602, 603, and 604, each resource block includes consecutive systematic bits and consecutive parity bits. Here, it is necessary to additionally distribute the consecutive systematic bits within each resource block, which can be achieved by one more interleaving for each resource block as indicated by reference numeral 605. As noted from 606, 607, and 608, systematic bits and parity bits are interleaved with each other in each resource block. Such additional distribution or interleaving is beneficial when one resource block has different channel environments.

It should be noted that the interleaving step 605 for each resource block could be omitted in the mapping method proposed by the present invention. Usually, the channel response on the frequency axis within one resource block does not change greatly. Therefore, the interleaving for each resource block may not have a large influence, and thus can be omitted.

Figure 7:
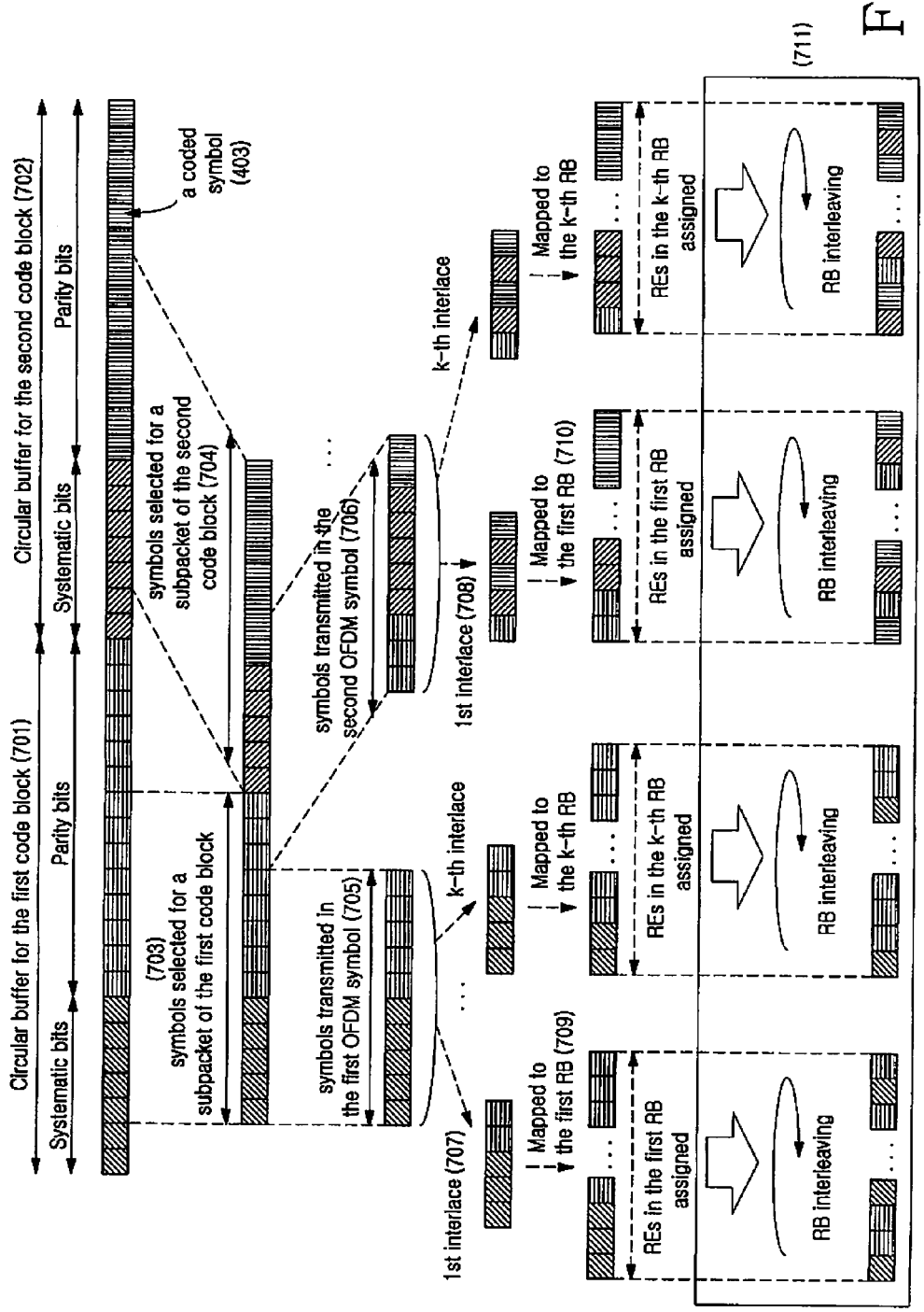
FIG. 7 illustrates an example of mapping when two or more coded blocks are transmitted to one UE according to a preferred embodiment of the present invention.

FIG. 7 illustrates an example of mapping when two or more coded blocks are transmitted to one UE according to a preferred embodiment of the present invention. FIG. 7 also illustrates a method for mapping a sub-packet to multiple resource blocks when a Node B allocates the multiple resource blocks to a particular user, configures a sub-packet, and then maps the sub-packet to the allocated resource blocks for transmission.

In the example illustrated in FIG. 7, the Node B transmits multiple coded blocks to the UE during a given time slot or Transmission Time Interval (TTI). As used herein, a coded block refers to an independent information bit block subject to encoding.

For example, it is assumed that a Node B wants to transmit 10,000 information bits to a particular UE. Usually, 10,000 bits are not turbo-coded at once because its decoding complexity becomes too large. Therefore, in such a case, it is usual to divide the 10,000 information bits into two 5,000 bit groups, and then separately turbo-code the two 5,000 bit groups. Each of the divided bit groups is usually called a "coded block." In the example illustrated in FIG. 7, multiple information bit streams are separately turbo-coded and are then transmitted in one TTI, as described above.

Referring to FIG. 7, a circular buffer for the first coded block 701 includes a systematic bit stream and a parity bit stream, and a circular buffer for the second coded block 702 also includes a systematic bit stream and a parity bit stream. For the coded blocks 701 and 702, sub-packets 703 and 704 are configured, respectively.

In the concatenated coded symbol stream including the sub-packets 703 and 704 concatenated to each other, a coded symbol to be transmitted through the first OFDM symbol is determined (705). Usually, this determination is based on the modulation scheme (QPSK, 16QAM, etc.) and the number of available sub-carriers for the first OFDM symbol. For the selected symbol 705, as many interlaces as the allocated resource blocks are configured in step 707. Configuration of the interlaces can be achieved through the same process as illustrated in step 601 of FIG. 6.

FIG. 7 illustrates a scenario in which k resource blocks have been allocated to the user. Therefore, in step 707, k interlaces are configured. The k interlaces are mapped to the k resource blocks, respectively, in step 709. For the mapped symbols, the same interleaving for each resource block as described above for step 605 of FIG. 6 can be additionally performed in step 711.

Next, in the concatenated coded symbol stream including the sub-packets 703 and 704 concatenated to each other, a coded symbol to be transmitted through the second OFDM symbol is determined in step 706. For the selected symbol in step 706, k interlaces, which correspond to the number of the allocated resource blocks, are configured as indicated by reference numeral 708. The k interlaces are mapped to the k resource blocks, respectively, in step 710. For the mapped symbols, the interleaving for each resource block can be additionally performed in step 711.

Figure 8:
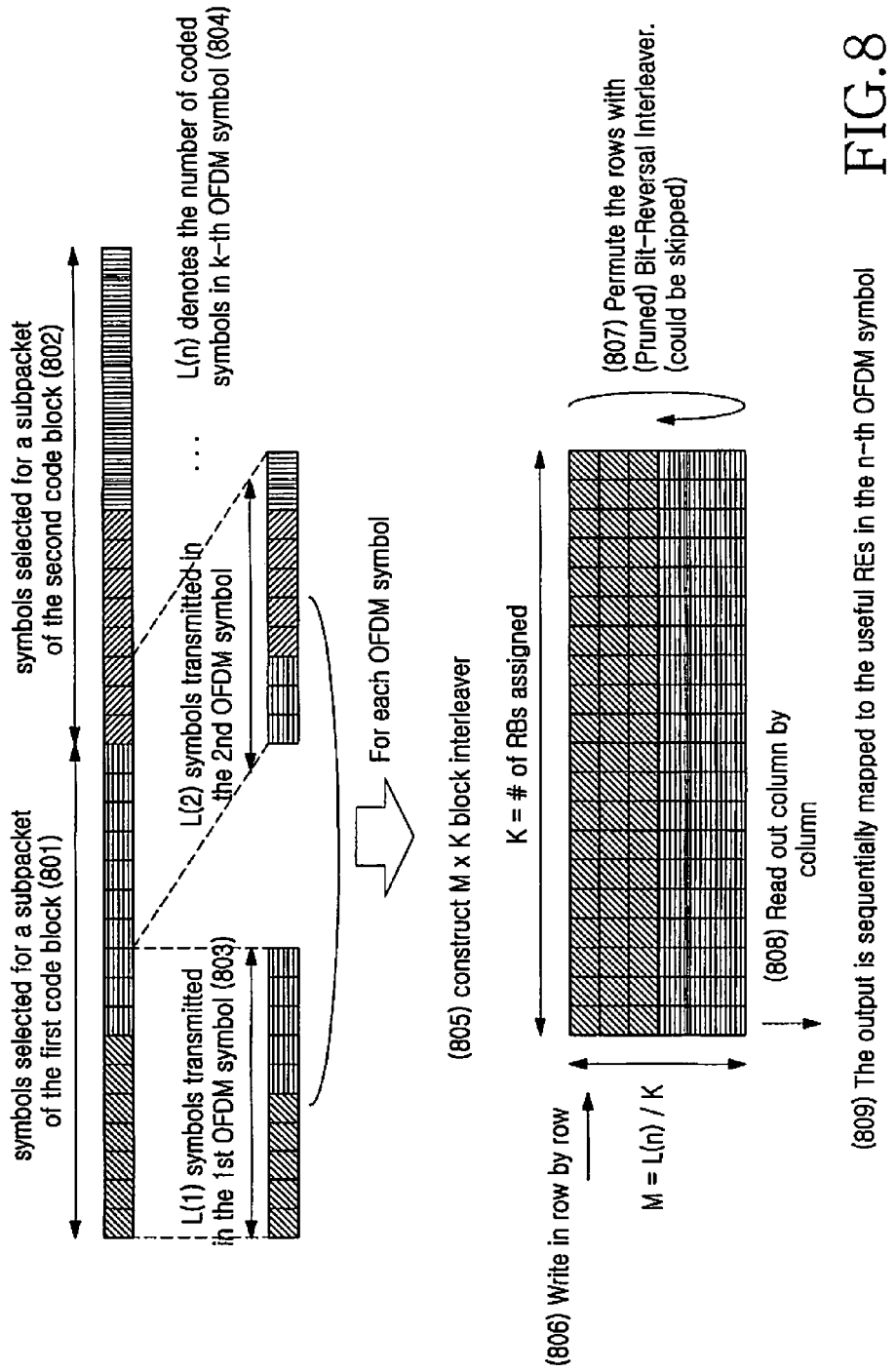
FIG. 8 illustrates an example of implementing the mapping as described above with reference to FIGS. 5 to 7 by a block interleaver.

FIG. 8 illustrates an example of implementing the mapping as described above with reference to FIGS. 5 to 7 by a block interleaver. Referring to FIG. 8, sub-packets 801 and 802 are configured for the first and second coded blocks, respectively. These sub-packets have the same configuration as described above regarding the embodiments described above. In the symbol stream including the codes blocks 801 and 802, a coded symbol transmitted through the first OFDM symbol is determined (803). It assumed that the number of the determined symbols is L(1).

Next, interleaving for the L(1) coded symbols is performed. For the interleaving, an M×K block interleaver is configured (805), wherein K denotes the number of allocated resource blocks and M=L(1)/K. The symbols 803 are input row by row to the block interleaver as described above. When the input is completed, the rows are interleaved according to a Pruned Bit Reversal Order (PBRO) scheme. The PBRO interleaving has the following algorithm as described in Table 2 below.

TABLE 2 y = PBRO (i, L(1))
wherein y indicates an output position, i indicates an input
position, and L(1) indicates the total number of inputs.
(Step 1) First, n, which is a PBRO parameter, is determined,
wherein n is a minimum integer satisfying a formula, $L(1) \leq 2^n$.
(Step 2) i and j are initialized to 0.
(Step 3) x is defined to signify a bit-reversed value of
j using an n-bit binary representation. For example,
if n is 4 and j is 3, x is 12.
(Step 4) if $x < N_{LE}$, set PBRO((i, $N_{LE}$) to x and increase i by 1.
(Step 5) Otherwise, increase j by 1.
(Step 6) if i < M, proceed to step 3.

Step 806 corresponds to implementing interleaving for each resource block as indicated by reference numeral 711 in FIG. 7, and can be omitted as described above.

Next, the symbols of the sub-carrier are read out column by column from the block interleaver in step 808. The output of the block interleaver is sequentially mapped to the available sub-carriers of a corresponding OFDM symbol. It should be obvious to one skilled in the art that descriptions on rows and columns in steps 806 to 809 in FIG. 8 can be exchanged.

Figure 9:
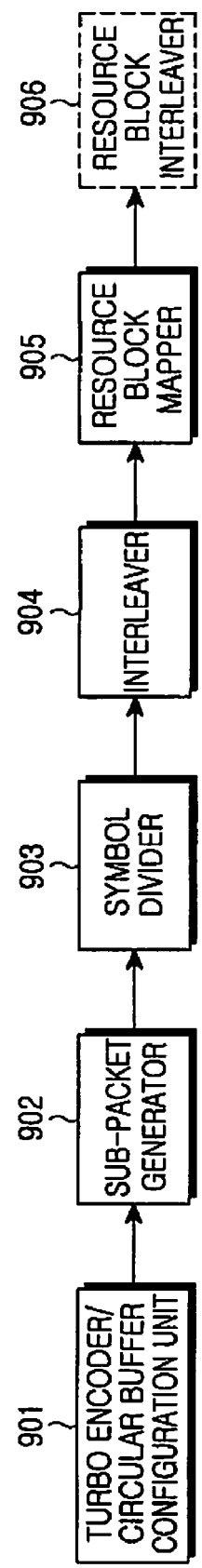
FIG. 9 is a block diagram illustrating a structure of a transmitter according to a preferred embodiment of the present invention.

FIG. 9 is a block diagram illustrating a structure of a transmitter according to a preferred embodiment of the present invention. In FIG. 9, reference numeral 901 indicates a turbo encoder/circular buffer configuration unit. Additionally, block 901 of FIG. 9 corresponds to blocks 202 to 205 of FIG. 2.

The sub-packet generator 902 configures a sub-packet by selecting coded symbols stored in a circular buffer of the a turbo encoder/circular buffer configuration unit 901. The symbol divider 903 divides the coded symbols included in the configured sub-packet into symbol streams transmitted to each OFDM symbol. The symbol divider 903 operates as illustrated in steps 703 and 704 of FIG. 7. The coded symbols to be transmitted to each OFDM symbol, which are output from the symbol divider 903, are input to and interleaved in the interleaver 904. The operation of the interleaver 904 is the same as that described above regarding steps 805 and 806 of FIG. 8. The output of the interleaver 904 is mapped to resource blocks, which will carry the symbols, by the resource block mapper 905. In the mapping, the output is sequentially mapped to available sub-carriers of the corresponding OFDM symbol as described above regarding step 809 illustrated in FIG. 8.

A resource block interleaver 906, which may be optionally connected to the resource block mapper 905, interleaves the symbols mapped by the resource block mapper 905 for each resource block.

Figure 10:
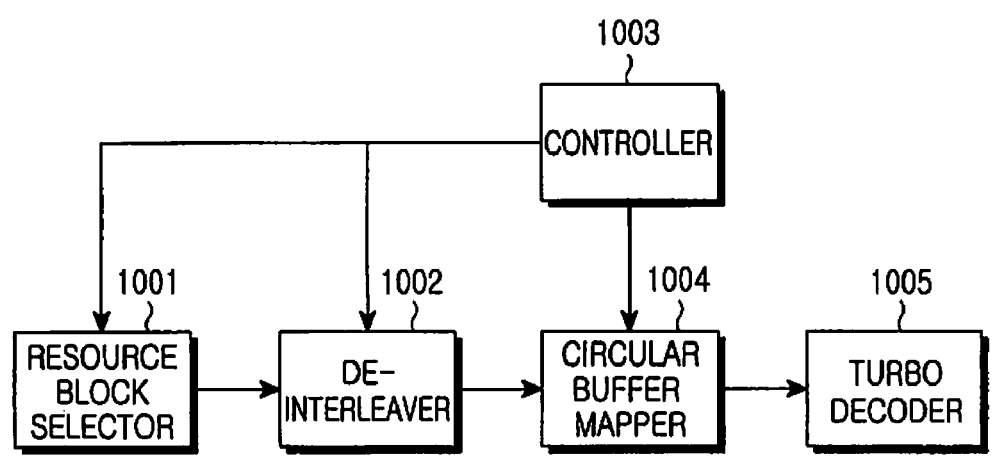
FIG. 10 is a block diagram illustrating a structure of a receiver according to a preferred embodiment of the present invention.

FIG. 10 is a block diagram illustrating a structure of a receiver according to a preferred embodiment of the present invention. Referring to FIG. 10, a resource block selector 1001 selects resource blocks for receiving data. It is assumed that a method for the selection has been known in advance. For example, when a UE receives data, the UE is allocated resource blocks from a Node B. When the UE receives resource allocation information, the UE selects resource blocks corresponding to the allocation information. Reception symbols obtained from the selected resource blocks are divided into parts, the quantity of each of which corresponds each OFDM symbol. The divided symbols are input to the de-interleaver 1002 for de-interleaving. The de-interleaving is an inverse process of steps 806 to 808 as illustrated FIG. 8 as described above.

A controller 1003 controls the division of the symbols obtained from the resource blocks according to the quantity of each OFDM symbol and controls the de-interleaving such that the de-interleaving can be repeated as many times as the number of the OFDM symbols included in the TTI. The de-interleaved symbols are mapped to the circular buffer mapper 1004. The controller 1003 controls the mapping such that the de-interleaved symbols can be mapped to right positions on the circular buffer mapper 1004. A turbo-decoder 1005 performs turbo-decoding by using the received symbols included in the circular buffer.

As described above, the present invention proposes a mapping method and an apparatus, which can uniformly distribute bits, especially systematic bits having a relatively high priority, to multiple resource blocks in mapping the transmission symbols, such as a sub-packet for HARQ, to the resource blocks for transmission in a circular buffer of an OFDMA mobile communication system. Further, the present invention presents an interleaver for implementing the same. Accordingly, a mobile communication system using a transmitter and a receiver according to the present invention can prevent systematic bits having a relatively high priority from being collectively carried by resource blocks in a relatively bad channel environment.

While the present invention has been shown and described with reference to certain preferred embodiments thereof, it is possible to employ various modifications without departing from the scope of the invention. For example, in the preferred embodiments of the present invention described above, coded symbols are mapped to a resource block. However, according to the principle of the present invention, modulation symbols obtained by modulating the coded symbols according to a modulation scheme, such as Quadrature Phase Shift Keying (QPSK), 16 Quadrature Amplitude Modulation (QAM), and 64 QAM, can be mapped to the resource block. Otherwise, modulation may be performed after the coded symbols are mapped to the resource block.

Although the modulation process is omitted in the above description on the embodiments of the present invention, it should be apparent to those skilled in the art that modulation symbols instead of the coded symbols can be mapped to the resource block, and that interleaving for the modulation symbols can be performed instead of interleaving for the coded symbols. It should also be noted that the mapping or interleaving methods as described above can also be applied to those cases.

Accordingly, the scope of the present invention cannot be limited to the embodiments described above, and should be defined by the claims attached below and equivalents thereof. While the present invention has been shown and described with reference to certain preferred embodiments thereof, it will be understood by those skilled in the art that various changes in form and details may be made therein without departing from the spirit and scope of the present invention as defined by the appended claims.

What is claimed is:

1. A method for transmitting a sub-packet in a mobile communication system of an Orthogonal Frequency Division Multiplexing (OFDM) scheme, the method comprising:
   dividing a first bit group of the sub-packet into a number of bit streams equal to a number of previously allocated resource blocks;
   dividing a second bit group of the sub-packet into the same number of bit streams as the first bit group, wherein the first bit group has a different priority than the second bit group;
   dividing a respective bit stream from each of the first bit group and the second bit group into as many interlaces as the previously allocated resource blocks;
   mapping a respective bit interlace to each of the resource blocks; and
   transmitting the respective interlace through each of the resource blocks.

2. The method of claim 1, wherein the sub-packet comprises coded symbols.

3. The method of claim 1, wherein the sub-packet comprises modulation symbols.

4. The method of claim 2, wherein the first bit group includes systematic bits.

5. The method of claim 2, wherein the second bit group includes parity bits.

6. The method of claim 1, further comprising:
   interleaving each of the interlaces for each of the resource blocks.

7. A method for transmitting a sub-packet in a mobile communication system of an Orthogonal Frequency Division Multiplexing (OFDM) scheme, the method comprising:
   generating the sub-packet having a first bit group and a second bit group by selecting symbols from coded symbols, the first bit group having a different priority than the second bit group;
   dividing each bit group of the sub-packet into a number of bit streams equal to a number of previously allocated resource blocks;
   dividing each bit group of the sub-packet into as many interlaces as the previously allocated resource blocks;
   mapping a respective interlace to each of the resource blocks; and
   transmitting the respective interlace through each of the resource blocks.

8. The method of claim 7, wherein the first bit group includes systematic bits.

9. The method of claim 7, wherein the second bit group includes parity bits.

10. The method of claim 7, further comprising:
interleaving each of the interlaces for each of the resource blocks.

11. A method for transmitting a sub-packet in a mobile communication system of an Orthogonal Frequency Division Multiplexing (OFDM) scheme, the method comprising:
generating the sub-packet having a first bit group and a second bit group by selecting symbols from coded symbols, the first bit group having a different priority than the second bit group;
configuring a block interleaver having a size of M×K, wherein K indicates a number of the resource blocks and M indicates a value obtained by dividing a number of symbols transmitted by a corresponding OFDM symbol by K;
outputting interleaved symbols by writing the symbols of the sub-packet row by row and reading the symbols of the sub-packet column by column;
mapping the interleaved symbols to sub-carriers within previously allocated resource blocks; and
transmitting the interleaved symbols through the resource blocks.

12. The method of claim 11, wherein the first bit group includes systematic bits.

13. The method of claim 11, wherein the second bit group includes parity bits.

14. An apparatus for transmitting a sub-packet in a mobile communication system of an Orthogonal Frequency Division Multiplexing (OFDM) scheme, the apparatus comprising:
a divider for dividing a first bit group of the sub-packet into a number of bit streams equal to a number of previously allocated resource blocks, dividing a second bit group of the sub-packet into the same number of bit streams as the first bit group, wherein the first bit group has a different priority than the second bit group, and dividing a respective bit stream from each of the first bit group and the second bit group into as many interlaces as the previously allocated resource blocks; and
a resource block mapper for mapping a respective interlace to each of the resource blocks, and transmitting the respective interlace through each of the resource blocks.

15. The apparatus of claim 14, wherein the sub-packet comprises coded symbols.

16. The apparatus of claim 14, wherein the sub-packet comprises modulation symbols.

17. The apparatus of claim 15, wherein the first bit group comprises systematic bits.

18. The apparatus of claim 15, wherein the second bit group comprises parity bits.

19. The apparatus of claim 14, wherein the resource block interleaver interleaves each of the interlaces for each of the resource blocks.

20. An apparatus for transmitting a sub-packet in a mobile communication system of an Orthogonal Frequency Division Multiplexing (OFDM) scheme, the apparatus comprising:
a sub-packet generator for generating a sub-packet having a first bit group and a second bit group by selecting symbols from coded symbols, the first bit group having a different priority than the second bit group;
a divider for dividing each bit group of the sub-packet into a number of bit streams equal to a number of previously allocated resource blocks, and dividing each bit group of the sub-packet into as many interlaces as the previously allocated resource blocks; and
a resource block mapper for mapping a respective interlace to each of the resource blocks, and outputting the respective interlace for transmission through each of the resource blocks.

21. The apparatus of claim 20, wherein the first bit group comprises systematic bits.

22. The apparatus of claim 20, wherein the second bit group comprises parity bits.

23. The apparatus of claim 20, wherein the resource block interleaver interleaves each of the interlaces for each of the resource blocks.

24. An apparatus for transmitting a sub-packet in a mobile communication system of an Orthogonal Frequency Division Multiplexing (OFDM) scheme, the apparatus comprising:
a sub-packet generator for generating the sub-packet having a first bit group and a second bit group by selecting symbols from coded symbols, the first bit group having a different priority than the second bit group;
a block interleaver for outputting interleaved symbols by writing the symbols of the sub-packet row by row and reading the symbols of the sub-packet column by column, the block interleaver having a size of M×K, wherein K indicates a number of the resource blocks and M indicates a value obtained by dividing a number of symbols transmitted by a corresponding OFDM symbol by K; and
a resource block mapper for mapping the interleaved symbols to sub-carriers within previously allocated resource blocks and transmitting the interleaved symbols through the resource blocks.

25. The apparatus of claim 24, wherein the first bit group comprises systematic bits.

26. The apparatus of claim 24, wherein the second bit group comprises parity bits.

* * * * *